US006586757B2

(12) United States Patent
Melnychuk et al.

(10) Patent No.: US 6,586,757 B2
(45) Date of Patent: Jul. 1, 2003

(54) PLASMA FOCUS LIGHT SOURCE WITH ACTIVE AND BUFFER GAS CONTROL

(75) Inventors: Stephan T. Melnychuk, Carlsbad, CA (US); William N. Partlo, Poway, CA (US); Igor V. Fomenkov, San Diego, CA (US); Richard M. Ness, San Diego, CA (US); Daniel L. Birx, late of Potomac, MD (US), by Deborah L. Birx, executrix; Richard L. Sandstrom, Encinitas, CA (US); John E. Rauch, Poway, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/875,719

(22) Filed: Jun. 6, 2001

(65) Prior Publication Data

US 2002/0014598 A1 Feb. 7, 2002

Related U.S. Application Data

(63) Continuation-in-part of application No. 09/690,084, filed on Oct. 16, 2000, and a continuation-in-part of application No. 09/590,962, filed on Jun. 9, 2000, and a continuation-in-part of application No. 09/442,582, filed on Nov. 18, 1999, now Pat. No. 6,452,199, and a continuation-in-part of application No. 09/324,526, filed on Jun. 2, 1999, which is a continuation-in-part of application No. 09/268,243, filed on Mar. 15, 1999, now Pat. No. 6,064,072, and a continuation-in-part of application No. 09/093,416, filed on Jun. 8, 1998, now Pat. No. 6,051,841, which is a continuation-in-part of application No. 08/854,507, filed on May 12, 1997, now Pat. No. 5,763,930.

(51) Int. Cl.$^7$ .............................................. H01J 35/20

(52) U.S. Cl. ................. 250/504 R; 250/493.1; 378/119

(58) Field of Search .......................... 250/504 R, 493.1; 378/119

(56) References Cited

U.S. PATENT DOCUMENTS

| 2,759,106 A | 8/1956 | Wolter | 250/53 |
|---|---|---|---|
| 3,150,483 A | 9/1964 | Mayfield et al. | 60/35.5 |

(List continued on next page.)

OTHER PUBLICATIONS

Apruzese, "X–Ray Laser Research Using Z Pinches," *American Institute of Physics*, pp. 399–401 (1994).

(List continued on next page.)

*Primary Examiner*—Jack Berman
(74) *Attorney, Agent, or Firm*—John R. Ross

(57) ABSTRACT

A high energy photon source. A pair of plasma pinch electrodes are located in a vacuum chamber. The chamber contains a working gas which includes a noble buffer gas and an active gas chosen to provide a desired spectral line. A pulse power source provides electrical pulses at repetition rates of 1000 Hz or greater and at voltages high enough to create electrical discharges between the electrodes to produce very high temperature, high density plasma pinches in the working gas providing radiation at the spectral line of the source or active gas. A fourth generation unit is described which produces 20 mJ, 13.5 nm pulses into 2 π steradians at repetition rates of 2000 Hz with xenon as the active gas. This unit includes a pulse power system having a resonant charger charging a charging capacitor bank, and a magnetic compression circuit comprising a pulse transformer for generating the high voltage electrical pulses at repetition rates of 2000 Hz or greater. Gas flows in the vacuum chamber are controlled to assure desired concentration of active gas in the discharge region and to minimize active gas concentration in the beam path downstream of the pinch region. In a preferred embodiment, active gas is injected downstream of the pinch region and exhausted axially through the center of the anode. In another preferred embodiment a laser beam generates metal vapor at a location close to but downstream of the pinch region and the vapor is exhausted axially through the anode.

27 Claims, 12 Drawing Sheets

U.S. PATENT DOCUMENTS

| | | | | |
|---|---|---|---|---|
| 3,232,046 A | 2/1966 | Meyer | | 60/35.5 |
| 3,279,176 A | 10/1966 | Boden | | 60/202 |
| 3,746,870 A | 7/1973 | Demarest | | 250/227 |
| 3,960,473 A | 6/1976 | Harris | | 425/467 |
| 3,961,197 A | 6/1976 | Dawson | | 250/493 |
| 3,969,628 A | 7/1976 | Roberts et al. | | 250/402 |
| 4,042,848 A | 8/1977 | Lee | | 313/231.6 |
| 4,088,966 A | 5/1978 | Samis | | 313/231.5 |
| 4,143,275 A | 3/1979 | Mallozzi et al. | | 250/503 |
| 4,162,160 A | 7/1979 | Witter | | 75/246 |
| 4,203,393 A | 5/1980 | Giardini | | 123/30 |
| 4,364,342 A | 12/1982 | Asik | | 123/143 |
| 4,369,758 A | 1/1983 | Endo | | 123/620 |
| 4,504,964 A | 3/1985 | Cartz et al. | | 378/119 |
| 4,507,588 A | 3/1985 | Asmussen et al. | | 315/39 |
| 4,536,884 A | 8/1985 | Weiss et al. | | 378/119 |
| 4,538,291 A | 8/1985 | Iwamatsu | | 378/119 |
| 4,561,406 A | 12/1985 | Ward | | 123/536 |
| 4,596,030 A | 6/1986 | Herziger et al. | | 378/119 |
| 4,618,971 A | 10/1986 | Weiss et al. | | 378/34 |
| 4,626,193 A | 12/1986 | Gann | | 431/71 |
| 4,633,492 A | 12/1986 | Weiss et al. | | 378/119 |
| 4,635,282 A | 1/1987 | Okada et al. | | 378/34 |
| 4,644,576 A | * 2/1987 | Kuyel | | 378/119 |
| 4,751,723 A | 6/1988 | Gupta et al. | | 378/119 |
| 4,752,946 A | 6/1988 | Gupta et al. | | 378/119 |
| 4,774,914 A | 10/1988 | Ward | | 123/162 |
| 4,837,794 A | 6/1989 | Riordan et al. | | 378/119 |
| 4,928,020 A | 5/1990 | Birx et al. | | 307/106 |
| 5,023,897 A | 6/1991 | Neff et al. | | 378/122 |
| 5,027,076 A | 6/1991 | Horsley et al. | | 324/674 |
| 5,102,776 A | 4/1992 | Hammer et al. | | 430/311 |
| 5,126,638 A | 6/1992 | Dethlefsen | | 315/326 |
| 5,142,166 A | 8/1992 | Birx | | 307/419 |
| 5,175,755 A | 12/1992 | Kumakhov | | 378/34 |
| 5,241,244 A | 8/1993 | Cirri | | 315/111.41 |
| 5,313,481 A | 5/1994 | Cook et al. | | 372/37 |
| 5,411,224 A | 5/1995 | Dearman et al. | | 244/53 B |
| 5,442,910 A | 8/1995 | Anderson | | 60/266 |
| 5,448,580 A | 9/1995 | Birx et al. | | 372/38 |
| 5,499,282 A | 3/1996 | Silfvast | | 378/119 |
| 5,504,795 A | 4/1996 | McGeoch | | 378/119 |
| 5,729,562 A | 3/1998 | Birx et al. | | 372/38 |
| 5,866,871 A | 2/1999 | Birx | | 219/121.48 |
| 5,936,988 A | 8/1999 | Partlo et al. | | 372/38 |
| 5,963,616 A | 10/1999 | Silfvast et al. | | 378/122 |
| 6,031,241 A | 2/2000 | Silfvast et al. | | 250/504 R |
| 6,109,574 A | 8/2000 | Pan et al. | | 248/176.1 |
| 6,172,324 B1 | 1/2001 | Birx | | 219/121.57 |

OTHER PUBLICATIONS

Bailey et al., "Evaluation of the gas puff z pinch as an x–ray lithography and microscopy source," *Appl. Phys. Lett.*, 40(1), pp. 33–35 (Jan. 1, 1982).

Bollanti et al., "Compact three electrodes excimer laser IANUS for a POPA optical system," In: *High–power gas and sol state lasers;* Proceedings of the Meeting, Vienna, Austria, Apr. 5–8, 1994 (A95–2267605–36), Bellingham, WA, Society of Photo–Optical Instrumentation Engineers, SPIE Proceedings, vol. 2206, pp. 144–153.

Bollanti et al., "Ianus, the three–electrode excimer laser," *Applied Physics B (Lasers and Optics)*, 66 (4), pp. 401–406, Publisher: Springer–Verlag (Apr. 1998).

Choi et al., "Temporal development of hard and soft x–ray emission from a gas–puff Z pinch," *Rev. Sci. Instrum.* 57(8), pp. 2162–2164 (Aug. 1986).

Fomenkov et al.. "Characterization of a 13.5 nm Source for EUV Lithography based on a Dense Plasma Focus and Lithium Emission," *Sematech International Workshop on EUV Lithography* (Oct. 1999).

Giordano and Letardi, "Magnetic pulse compressor for prepulse discharge in spiker–sustainer excitati technique for XeCl lasers," *Rev. Sci. Instrum* 65(8), pp. 2475–2481 (Aug. 1994).

Jahn, *Physics of Electric Propulsion*, McGraw–Hill Book Company, (Series in Missile and Space U.S.A.), Chap. 9, "Unsteady Electromagnetic Acceleration," p. 257 (1968).

Lebert et al., "Soft x–ray emission of laser–produced plasmas using a low–debris cryogenic nutrogen target," *J. of Appl. Physics*, 84(6), pp. 3419–3421 (Sep. 15, 1998).

Lebert et al., "A gas discharged based radiation source for EUV–lithography," *International Conference Micro– and Nano–Engineering 98*, Sep. 2–24, Leuven, Belgium, 5 pages.

Lebert et al., "Comparison of laser produced and gas discharge based EUV sources for different applications," *International Conference Micro– and Nano–Engineering 98*, Sep. 22–24, 1998, Leuven, Belgium, 6 pages.

Lebert et al., "Investigation of pinch plasmas with plasma parameters promising ASE," *Inst. Phys. Conf. Ser.*, 125(9) pp. 411–415 (1992).

Lewis, "Status of Collision–Pumped X–ray Lasers," *Am. Inst. Of Phys.*, pp. 9–16 (1994).

Lowe, "Gas plasmas yield X rays for Lithography," *Electronics*, pp. 40–41 (Jan. 27, 1982).

Maimqvist et al., "Liquid–jet target for laser–plasma soft x–ray generation," *Rev. Sci. Instrum.*, 67(12), pp. 4150–4153 (Dec. 1996).

Mather, "Formation of a High–Densty Deuterium Plasma Focus," *The Physics of Fluids*, 8(2), 366–377 (Feb. 1965).

Matthews and Cooper, "Plasma sources for x–ray lithography," *SPIE*, 333, Submicron Lithography, pp. 136–139 (1982).

Nilsen and Chandler, "Analysis of the resonantly photo-pumped Na–Ne x–ray–laser scheme," *Physical Review*, 44(7), pp. 4591–4597 (Oct. 1, 1991).

Partlo et al., "EUV (13.5 nm) Light Generation Using a Dense Plasma Focus Device," *SPIE Proc. On Emerging Lithographic Technologies III*, vol. 3676, pp. 846–858 (Mar. 1999).

Pearlman and Riordan, "X–ray lithography using a pulsed plasma source," *J. Vac. Sci. Technol,.* pp. 1190–1193 (Nov./Dec. 1981).

Porter et al., "Demonstration of Population Inversion by Resonant Photopumping in a Neon Gas Cell Irradiated by a Sodium Z Pinch," *Physical Review*, 68(6), pp. 796–799 (Feb. 10, 1992).

Qi et al., "Fluorescence in Mg IX emission at 48.340 Å from Mg pinch plasmas photopumped by Al XI line radiation at 48.338 Å," Physical Review, 47(3), pp. 2253–2263 (Mar. 1993).

Schriever et al., "Laser–produced lithium plasma as a narrow–band extended ultraviolet radiation source for electron spectroscopy," *Applied Optics*, 37(7), pp. 1243–1248 (Mar. 1, 1998).

Schriever et al., "Narrowband laser produced extreme ultraviolet source adapted to silicon/molybdenum multilayer optics," *J. of Appl. Phys.,* 83(9), pp. 4566–4571 (May 1, 1998).

Shiloh et al., "Z Pinch of a Gas Jet," *Physical Review Lett.,* 40(8), pp. 515–518 (Feb. 20, 1978).

Silfvast et al., "High–power plasma discharge source at 13.5 nm and 11.4 nm for EUV lithography," *SPIE Proc. On Emerging Lithography Technologies III,* 3676, pp. 272–275 (Mar. 1999).

Silfvast et al., "Lithoum hydride capillary discharge creates x–ray plasma at 13.5 namometers," *Laser Focus World,* p. 13, (Mar. 1997).

Stallings et al., "Imploding argon plasma experiments," *Appl. Phys. Lett.,* 35(7), pp. 524–526 (Oct. 1, 1979).

Wilhein et al., "A slit grating spectrograph for quantitative soft x–ray spectroscopy," *Rev. of Scientific Instruments,* 70(3), pp. 1694–1699 (Mar. 1999).

Wu et al., "The Vacuum Spark and Spherical Pinch X–ray/EUV Point Sources," *SPIE Proc. On Emerging Lithographic Technologies III,* 3676, pp. 410–420 (Mar. 1999).

Price, Robert H., "X–Ray Microscopy Using Grazing Incidence Reflection Optics," *American Institute of Physics,* pp. 189–199 (1981).

Zombeck, M. V., "Astrophysical Observations with High Resolution X–ray Telescopes," *American Institute of Physics,* pp. 200–209 (1981).

\* cited by examiner

PLASMA FOCUS LIGHT SOURCE WITH ACTIVE AND BUFFER GAS CONTROL

This application is a continuation-in-part of U.S. Ser. No. 09/690,084, filed Oct. 16, 2000, U.S. Ser. No. 09/590,962, filed Jun. 9, 2000, U.S. Ser. No. 09/442,582, filed Nov. 18, 1999, now U.S. Pat. No. 6,452,199 and U.S. Ser. No. 09/324,526, filed Jun. 2, 1999 which was a continuation-in-part of U.S. Ser. No. 09/268,243 filed Mar. 15, 1999 now U.S. Pat. No. 6,064,072 and U.S. Ser. No. 09/093,416, filed Jun. 8, 1998 now U.S. Pat. No. 6,051,841 which was a CIP of Ser. No. 08/854,507 filed May 12, 1997, which is now U.S. Pat. No. 5,763,930. This invention relates to high energy photon sources and in particular highly reliable x-ray and high energy ultraviolet sources.

BACKGROUND OF THE INVENTION

The semiconductor industry continues to develop lithographic technologies which can print ever smaller integrated circuit dimensions. The current state-of-the-art light sources for this industry are 248 nm and 193 nm excimer lasers.

The demands of the integrated circuit industry will soon exceed the resolution capabilities of 193 nm exposure sources, thus creating a need for a reliable exposure source at a wavelength significantly shorter than 193 nm. $F_2$ excimer lasers operating at 157 nm are available and this source may be utilized to further reduce circuit dimensions.

The present state of the art in high energy ultraviolet light sources utilizes plasmas produced by bombarding various target materials with laser beams, electrons or other particles. Solid targets have been used, but the debris created by ablation of the solid target has detrimental effects on various components of a system intended for production line operation. A proposed solution to the debris problem is to use a frozen liquid or frozen gas target so that the debris will not plate out onto the optical equipment. However, none of these systems have proven to be practical for production line operation.

It has been well known for many years that x-rays and high energy ultraviolet radiation could be produced in a plasma pinch operation. In a plasma pinch an electric current is passed through a plasma in one of several possible configuration such that the magnetic field created by the flowing electric current accelerates the electrons and ions in the plasma into a tiny volume with sufficient energy to cause substantial stripping of outer electrons from the ions and a consequent production of x-rays and high energy ultraviolet radiation.

Typical prior art plasma pinch devices can generate large amounts of radiation suitable for proximity x-ray lithography, but are limited in repetition rate due to large per pulse electrical energy requirements, and short lived internal components. The stored electrical energy requirements for these systems range from 1 kJ to 100 kJ. The repetition rates typically did not exceed a few pulses per second.

What is needed is a production line reliable, simple system for producing high energy ultraviolet and x-radiation which operates at high repetition rates and avoids prior art problems associated with debris formation.

SUMMARY OF THE INVENTION

The present invention provides a high energy photon source. A pair of plasma pinch electrodes are located in a vacuum chamber. The chamber contains a working gas which includes a noble buffer gas and an active gas chosen to provide a desired spectral line. A pulse power source provides electrical pulses at repetition rates of 1000 Hz or greater and at voltages high enough to create electrical discharges between the electrodes to produce very high temperature, high density plasma pinches in the working gas providing radiation at the spectral line of the source or active gas. A fourth generation unit is described which produces 20 mJ, 13.5 nm pulses into 2 π steradians at repetition rates of 2000 Hz with xenon as the active gas. This unit includes a pulse power system having a resonant charger charging a charging capacitor bank, and a magnetic compression circuit comprising a pulse transformer for generating the high voltage electrical pulses at repetition rates of 2000 Hz or greater. Gas flows in the vacuum chamber are controlled to assure desired concentration of active gas in the discharge region and to minimize active gas concentration in the beam path downstream of the pinch region. In a preferred embodiment, active gas is injected downstream of the pinch region and exhausted axially through the center of the anode. In another preferred embodiment a laser beam generates metal vapor at a location close to but downstream of the pinch region and the vapor is exhausted axially through the anode.

A reflection radiation collector-director collects radiation produced in the plasma pinch and directs the radiation in a desired direction. Embodiments are described for producing a focused beam. In one preferred embodiment a tandem ellipsoidal mirror is used to produce a focused beam having improved beam properties.

Preferred embodiments include a debris collector located between the pinch region and the radiation collector-director. The debris collector is comprised of a large number of passages each passage aligned with rays eminating from the pinch region which permits the passage of light rays which travel in straight lines but retards the passage of debris which travel along more random paths. In addition a gas flow is provided through the debris collector in a direction toward the pinch region to further retard debris penetration and active gas penetration toward the radiation collector-director.

In still another embodiment, the active gas is injected axially through the anode and exhausted along with buffer gas upstream of the debris collector.

DETAILED DESCRIPTION OF PREFERRED EMBODIMENTS

Fourth Generation Pinch Device

Figure 1:
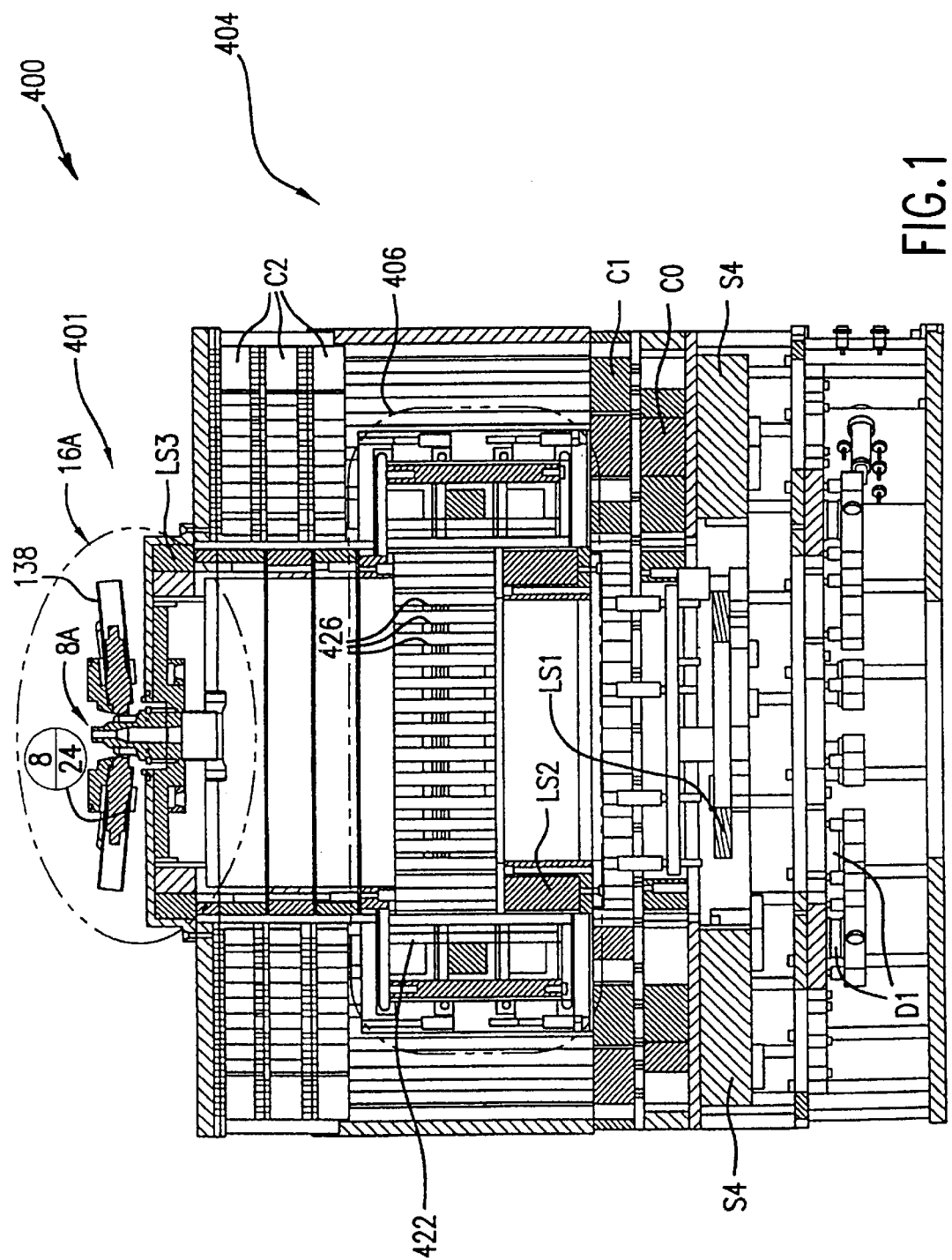
FIG. 1 shows a cross section of a fourth generation plasma pinch device.
Figure 1A:
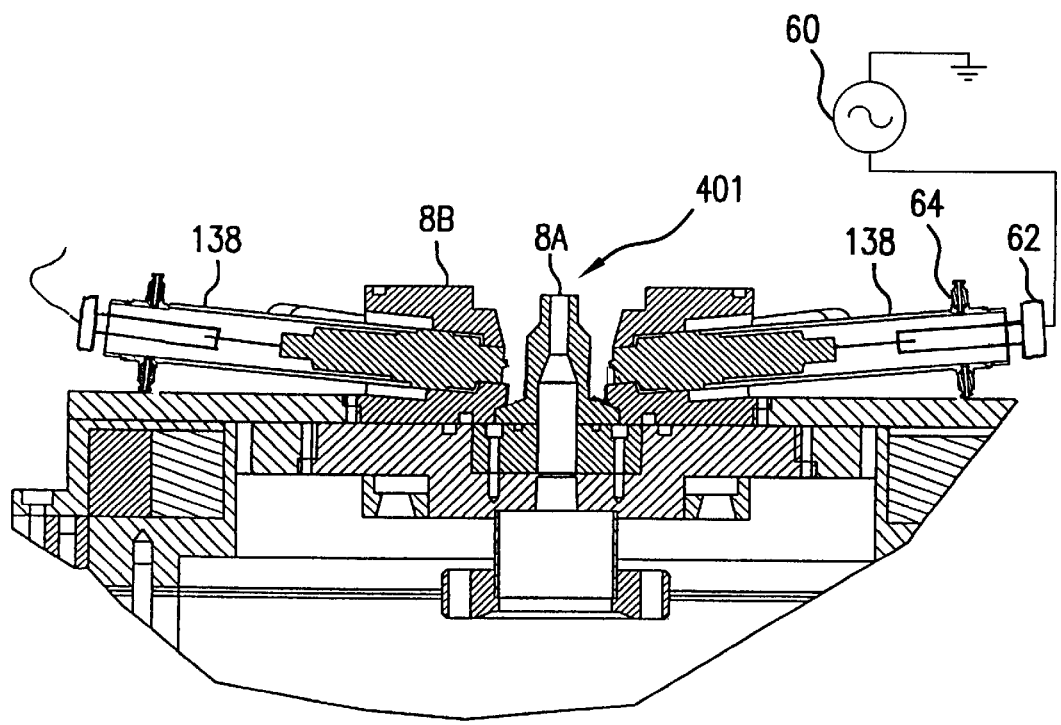
FIG. 1A is an enlarged cross section drawing showing the anode, cathode and preionizers of the FIG. 1 device.
Figure 1C:
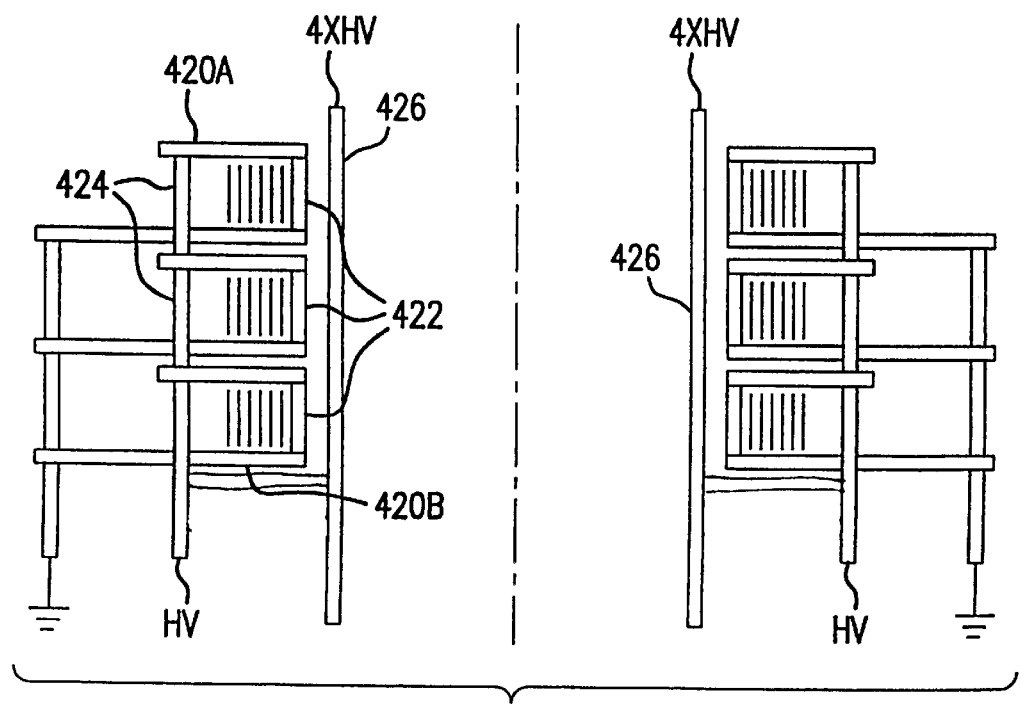
FIG. 1C shows some features of a pulse transformer used in the FIG. 1 device.
Figure 1B:
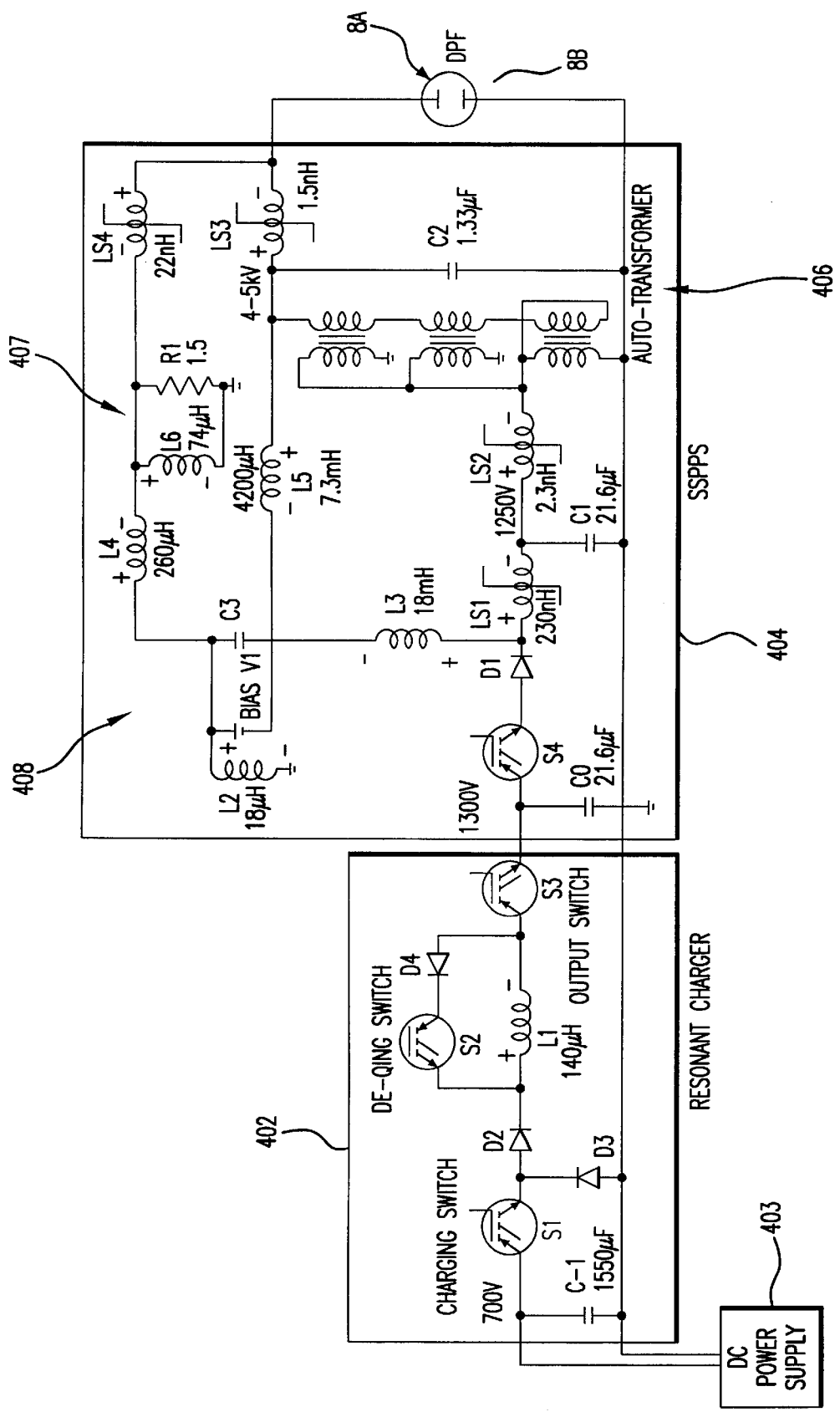
FIG. 1B is an electrical drawing of the pulse power system for the FIG. 1 device.

FIG. 1 is a cross section drawing of a fourth generation prototype plasma pinch device 400 built and tested by Applicants. FIG. 1A is an enlarged portion of the device showing in detail a the pinch region 401. FIG. 1B is a circuit diagram showing the important electrical elements of the high voltage pulse power drive system for this embodiment. This unit produces plasma pinches at pulse repetition rates of up to about 2 kHz. The electrical energy discharged between the electrodes is about 12 J per pulse. With this device and xenon as the active gas, Applicants have measured useful light energy in excess of 20 mJ produced by each pinch in the EUV wavelength range of interest into 2 π steradians.

Substantially all of the components shown in FIG. 1 are a part of the solid state pulse power system 404 for supplying the discharge electrical pulses of the electrodes. In this embodiment, a positive voltage pulse of about 4–5 kV is applied to the central anode 8A. The cathode 8B is at ground potential. Preionization is provided by 8 spark devices 138 which produce preionization sparks at the bottom of the space between the cathode and the anode. These spark devices operate at 20 kV using as a power supply a 30 kV 10 mHz sine wave generator (not shown). These spark devices are driven by a 10 MHz sine wave generator producing a 30 kV at the output.

Electrical Circuit

A description of the electrical circuit diagram of this preferred pulse power system is set forth below with reference to FIG. 1B and occasionally to FIGS. 1 and 1A.

Resonant Charger

A conventional approximately 700 V dc power supply is used to convert ac electrical power from utility 208 volt, 3 phase power into approximately 700 V dc 50 A power. This power supply 403 provides power for resonant charger unit 402. Power supply 403 charges up a large 1500 $\mu$F first capacitor bank, C-1. Upon command from the external trigger signal, the resonant charger initiates a charging cycle by closing the command-charging switch, S1. Once the switch closes, a resonant circuit is formed from the C-1 capacitor, a charging inductor L1, and a C0 capacitor bank which forms a part of solid pulse power system (SSPPS) 404. Current therefore begins to discharge from C-1 through the L1 inductor and into C0, charging up that capacitance. Because the C-1 capacitance is much, much larger than the C0 capacitance, the voltage on C0 can achieve approximately 2 times the initial voltage of that on C-1 during this resonant charging process. The charging current pulse assumes a half-sinusoidal shape and the voltage on C0 resembling a "1-cosine" waveform.

In order to control the end voltage on C0, several actions may take place. First, the command-charging switch S1 can be opened up at any time during the normal charging cycle. When S1 opens, current ceases to flow from C-1 but the current that has already been built up in the charging inductor L1 (which can be substracted) continues to flow into C0 through the free-wheeling diode D3.

In addition, the de-qing switch S2 across the charging inductor can be closed, effectively short-circuiting the charging inductor and "de-qing" the resonant circuit. This essentially removes the inductor from the resonant circuit and prevents any further current in the inductor from continuing to charge up C0. Current in the inductor is then shunted away from the load and trapped in the loop made up of charging inductor L1, the de-qing switch S2, and the de-qing diode D4. Diode D4 is included in the circuit since the IGBT has a reverse anti-parallel diode included in the device that would normally conduct reverse current. As a result, diode D4 blocks this reverse current which might otherwise bypass the charging inductor during the charging cycle.

Finally, a "bleed down" or shunt switch and series resistor (both not shown in this preferred embodiment) can be used to discharge energy from C0 once the charging cycle is completely finished in order to achieve very fine regulation of the voltage on C0.

The dc power supply 403 is a 208 V, 90 A, ac input, 800 V, 50 A dc output regulated voltage power supply provided by vendors such as Universal Voltronics, Lambda/EMI, Kaiser Systems, Sorensen, etc. A second embodiment can use multiple, lower power, power supplies connected in series and/or parallel combinations in order to provide the total voltage, current, and average power requirements for the system.

The C-1 capacitor is comprised of two 450 V dc, 3100 $\mu$F, electrolytic capacitors connected together in series. The resulting capacitance is 1500 $\mu$F rated at 900 V, providing sufficient margin over the typical 700–800 V operating range. These capacitors can be obtained from capacitor vendors such as Sprague, Mallory and Aerovox.

The command charging switch S1 and output series switch S3 in the embodiment are 1200 V, 300 A IGBT switches. The actual part number of the switches is CM300HA-24H from Powerex. The de-qing switch S2 is a 1700 V, 400 A IGBT switch, also from Powerex, part number CM400HA-34H.

The charging inductor L1 is an inductor made with 2 sets of parallel windings (20 turns each) of Litz wire made on a toroidal, 50–50% NiFe tape wound core with two ⅛" air gaps and a resulting inductance of approximately 140 $\mu$H. National Arnold provides the specific core. Other embodiments can utilize different magnetic materials for the core such as Molypermaloy or Metglas™.

The series, de-qing, and freewheeling diodes are all 1400 V, 300 A diodes from Powerex, part number R6221430PS.

Pulse Compression and Voltage Amplification

Once the resonant charger 402 charges up C0, a trigger is generated by a control unit (not shown) in the resonant charger that triggers the IGBT switches S4 to close. Although only one is shown in the schematic diagram, S4 actually consists of eight parallel IGBT's which are used to discharge C0 into C1. Current from the C0 capacitors then discharges through the IGBT's and into a first magnetic switch LS1. Sufficient volt-seconds are provided in the design of this magnetic switch to allow all of the 8 parallel IGBT's to fully turn on (i.e. close) prior to substantial current building up in the discharge circuit. After closure the main current pulse is generated and used to transfer the energy from C0 into C1. The transfer time from C0 to C1 is typically on the order of 5 $\mu$s with the saturated inductance of LS1 being approximately 230 nH. As the voltage on C1 builds up to the full desired voltage, the volt-seconds on a second magnetic switch LS2 run out and that switch saturates, transferring the energy on C1 into 1:4 pulse transformer 406 which is described in more detail below. The transformer basically consists of three one turn primary "windings" connected in parallel and a single secondary "winding". The secondary conductor (in an auto-transformer configuration) is tied to the high voltage terminal of the primaries with the result that the step-up ratio becomes 1:4 instead of 1:3. The secondary "winding" is then tied to capacitor bank C2 that is then charged up by the transfer of energy from C1 (through the pulse transformer). The transfer time from C1 to C2 is approximately 500 ns with the saturated inductance of LS2 being approximately 2.3 nH. As the voltage builds up on C2, the volt-second product of the third magnetic switch LS3 is achieved and it also saturates, transferring the voltage on C2 to anode 8a shown on FIGS. 1A and 1B. The saturated inductance of LS3 is approximately 1.5 nH.

Over Voltage Protection

A fourth magnetic switch LS4 is provided as a protection device in case the DPF is not functioning properly. In the case where the pre-ionization pulse is not applied at the right time Oust prior to the main pulse), the main pulse voltage is not sufficient to break down the gas between the anode and cathode so the gas acts as an insulator. As a result, the pulsed voltage into this open-circuit condition can essentially double leading to an undesirable breakdown in the machine at some location other than the desired DPF electrodes. In this case, most of the energy is then reflected back to the "front end" of the SSPPS. Such a large reverse voltage pulse can cause avalanching of the series diode in the SSPPS, leading to potential damage or destruction of the devices. This fourth magnetic switch is designed such that its volt-second product will be exceeded if the main DPF electrodes do not break down. If this happens, the magnetic switch LS4 shorts the load prior to the voltage doubling to prevent damage. The saturated inductance of switch LS4 is approximately 22 nH and it is terminated into a parallel RL load 407 with about 1.5 ohms resistance and about 75 $\mu$H inductance.

Bias Circuit

Bias circuitry shown in the schematic diagram 1B at 408 is also used to properly bias the four magnetic switches. Current from the bias power supply V1, passes through magnetic switches LS4 and LS3. It then splits and a portion of the current passes through bias inductor L5 and back to the bias power supply V1. The remainder of the current passes through the pulse transformer secondary winding and then through magnetic switches LS2 and LS1 and bias inductor L3 back to the bias power supply V1. Bias inductor L2 provides a path back to power supply from ground for current flowing through the pulse transformer 406 primary to ground. Bias inductors L3 and L5 also provide voltage isolation during the pulse in the SSPPS since the bias power supply V1 operates close to ground potential (as opposed to the potentials generated in the SSPPS where the bias connections are made).

Capacitor Banks

The C0, C1 and C2 capacitances are made up of a number of parallel, polypropylene film capacitors mounted on a printed circuit board with thick (6–10 oz.) copper plating. The printed circuit boards are wedge shaped such that 4 boards make up a cylindrical capacitor deck which feeds a cylindrical bus for both the high voltage and ground connections. In such a way, a low inductance connection is formed which is important to both the pulse compression and to the stability of the plasma pinch in the DPF itself. The total capacitance for C0 and C1 are 21.6 $\mu$F each while the total capacitance for C2 is 1.33 $\mu$F. The C0 capacitors are 0.047 $\mu$F, 2000 V capacitors and the capacitors are 0.1 $\mu$F, 1600 V capacitors obtained from vendors such as Wima in Germany or Vishay Roederstein in North Carolina. The C2 capacitance is made up of three sections of capacitors stacked in series to achieve the overall voltage rating since the voltage on the secondary of the pulse transformer is ~5 kv. The C2 capacitors are 0.01 $\mu$F, 2000 V dc components, again from Wima or Vishay Roederstein.

Switches and Diodes

The SSPPS switches are 1400 V, 1000 A IGBT switches. The actual part number is CM1000HA-28H from Powerex. As noted earlier, 8 parallel IGBT switches are used to discharge C0 into C1.

Magnetic switch LS1 is a custom made inductor made with 16 sets of parallel windings (6 turns each) of Litz wire made on a toroidal, ferrite core. The specific core is provided by Ceramic Magnetics of New Jersey and is made of CN-20 ferrite material. The toroid is 0.5" thick with an I.D. of 5.0" and an O.D. of 8.0".

Magnetic switch LS2 is a single turn, toroidal inductor. The magnetic core is tape wound on a 8.875" O.D. mandrel using 2" wide, 0.7 mil thick, 2605-SC Metglas™ from Honeywell with 0.1 mil thick Mylar wound in between layers to an outside diameter 10.94".

Magnetic switch LS3 is also a single turn, toroidal inductor. The magnetic core is tape wound on a 9.5" O.D. mandrel using 1" wide, 0.7 mil thick, 2605-S3A Metglas™ from Honeywell with 0.1 mil thick Mylar wound in between layers to an outside diameter of 10.94".

Pulse Transformer

The pulse transformer is similar in construction to that described in U.S. Pat. No. 5,936,988 except that it has fewer cores and the diameter of each of the cores is much larger. Each of the three transformer cores is tape wound on a 12.8-inch O.D. mandrel 422 using 1" wide, 0.7 mil thick, 2605-S3A Metglas™ from Honeywell with 0.1 mil thick Mylar wound in between layers to an outside diameter of 14.65". Each of the three cores 418 are ring shaped, 12.8 I.D. and about 14 inch O.D. having heights of 1 inch. An axial cross section sketch showing the physical arrangement of the three cores and the primary and secondary "windings" is shown in FIG. 1C. Each of the three primary windings actually are formed from two circular flat rings 420A and 420B bolted to ring-shaped mandrel 422 and rod-like spacers 424. The secondary "winding" is comprised of 48 circularly spaced bolts 426 all connected in parallel to function as single straight-through conductor.

The transformer operates on a principal similar to that of a linear accelerator. A high voltage current pulse in the three primary "windings" induce a voltage rise in the secondary "winding" approximately equal to the primary voltage. The result is a voltage generated in the secondary winding (i.e., the 48 parallel rods 426) equal to three times the primary voltage pulse. But since the low voltage side of the secondary winding is tied to the primary windings a four fold transformation is provided.

Inductors

Bias inductors L3 and L4 are both toroidal inductors wound on a Molypermalloy magnetic core. The specific core dimensions are a height of 0.8", an I.D. of 3.094", and an O.D. of 5.218". The part number of the core is a-430026-2 from Group Arnold. Inductor 13 has 90 turns of 12 AWG wire wound on the toroid for an inductance of ~7.3 mH while L4 has 140 turns of 12 AWG wire wound on it for an inductance of ~18 mH.

Bias inductor L6 is merely 16 turns of 12 AWG wire wound in a 6" diameter. Bias inductor L4 is 30 turns of 12 AWG wire in a 6" diameter. Bias inductor L2 is 8 turns of 12 AWG wire in a 6" diameter.

Other Components

Resistor R1 is an array of twenty parallel resistors, each of which is 27 ohm, 2 W carbon composition resistor.

The SSPPS series diodes are all 1400 V, 300 A diodes from Powerex, part number R6221430. Two diodes are used for each IGBT switch, resulting in a total of sixteen parallel devices.

Energy Recovery

In order to improve the overall efficiency, this fourth generation dense plasma focus device provides for energy recovery on a pulse-to-pulse basis of electrical pulse energy reflected from the discharge portion of the circuit. The energy recovery technique utilized herein is similar to that described in U.S. Pat. No. 5,729,562 which is incorporated herein by reference. Energy recovery is achieved as explained below by reference to FIG. 1B.

Figure 1D:
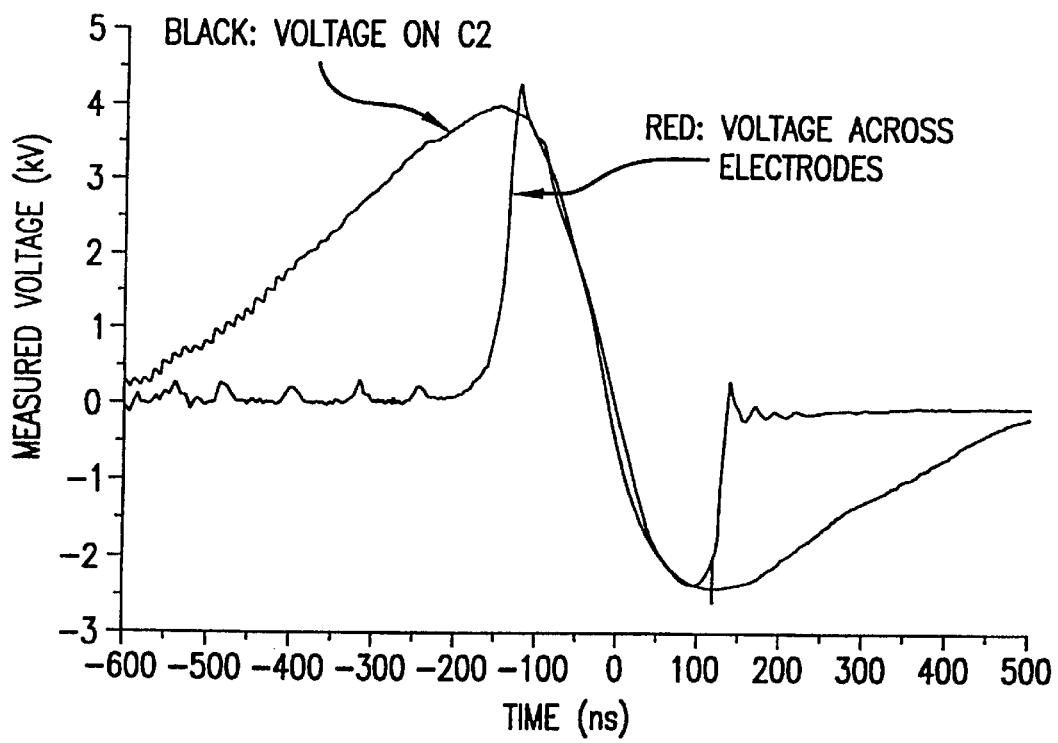
FIGS. 1D and 1E show discharge pulse shapes and the shape of the EUV pulse produced by the FIG. 1 device.

After the discharge C2 is driven negative as shown in FIG. 1D. When this occurs, LS2 is already saturated for current flow from C1 to C2. Thus, instead of having energy ringing in the device (which tends to cause electrode erosion) the saturated state of LS2 causes the reverse charge on C2 to be transferred resonantly back into C1. This transfer is accomplished by the continued forward flow of current through LS2. After the transfer of charge from C2 to C1, C1 then has a negative potential as compared to C0 (which at this time is at approximately ground potential) and (as was the case with LS2) LS1 continues to be forward conducting due to the large current flow during the pulse which has just occurred. As a consequence, current flows from C0 to C1 bringing the potential of C1 up to about ground and producing a negative potential on C0.

The reader should note that this reverse energy transfers back to C0 is possible only if all the saturable inductors (LS1, LS2 and LS3) remain forward conducting until all or substantially all the energy is recovered on C0. After the waste energy is propogated back into C0, C0 is negative with respect to its initial stored charge. At this point switch S4 is opened by the pulse power control. Inverting circuit comprising inductor L1 and solid state diode D3 coupled to ground causes a reversal of the polarity of C0 as the result of resonant free wheeling (i.e., half cycle of ringing of the L1-C0 circuit as clamped against reversal of the current in inductor L1 by diode D3 with the net result that the energy is recovered by the partial recharging of C0). In the preferred embodiment, the de-qing switch is left closed during this time period and, as a result, the voltage on C0 stops at approximately 0 volts potential during the energy recovery process and the recovered energy is stored in the form of current in the charging inductor, L1. The de-qing switch is held closed during the entire time until the next pulse is required, maintaining the recovered energy current in the circuit and storing it for later use. Therefore, the energy which otherwise would have contributed to the erosion of the electrodes is recovered reducing the charging requirements for the following pulse. Once the next pulse is needed, the de-qing switch, S2, is turned off simultaneously with turning on the charging switch, S1. At this time, the remainder of the recovered energy current (some loss of energy will occur because of the finite resistance in the de-qing circuit) is added to charging current from C-1 and the sum of the two begins to charge C0 positively.

In a second embodiment, the recovered voltage is stored as a negative voltage on C0 by opening the output switch S3 at the point in time during the energy recovery process when the C0 voltage reaches its negative peak voltage.

Spark Preionization

Figure 1E:
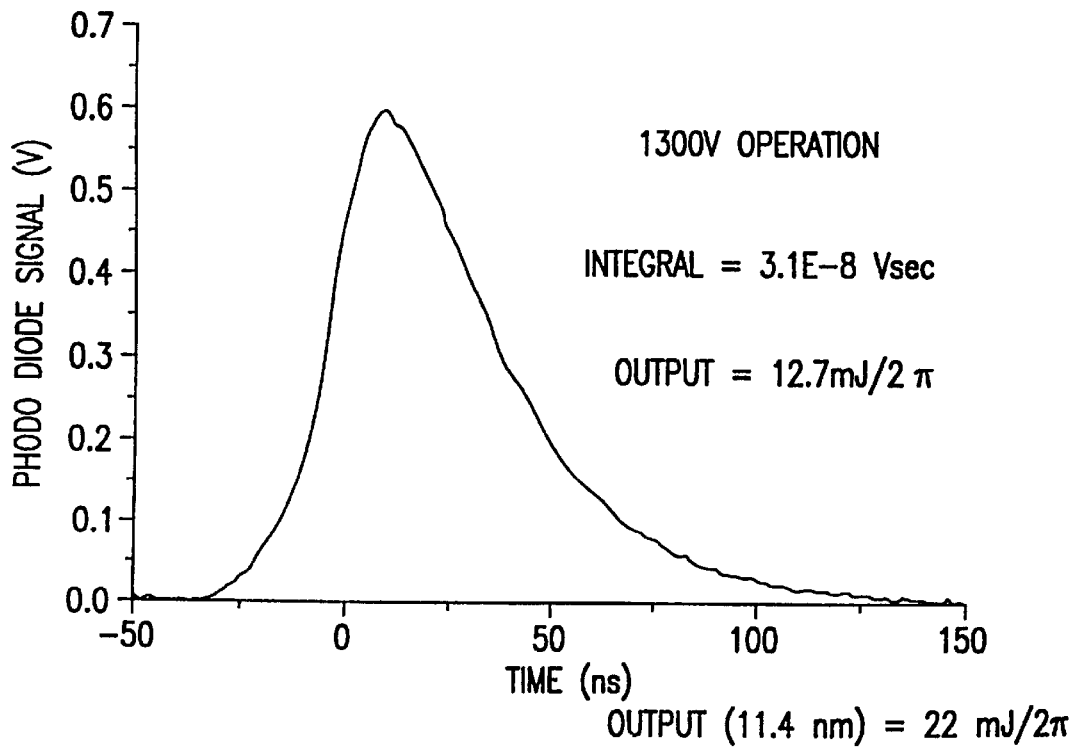
Figure 1F:
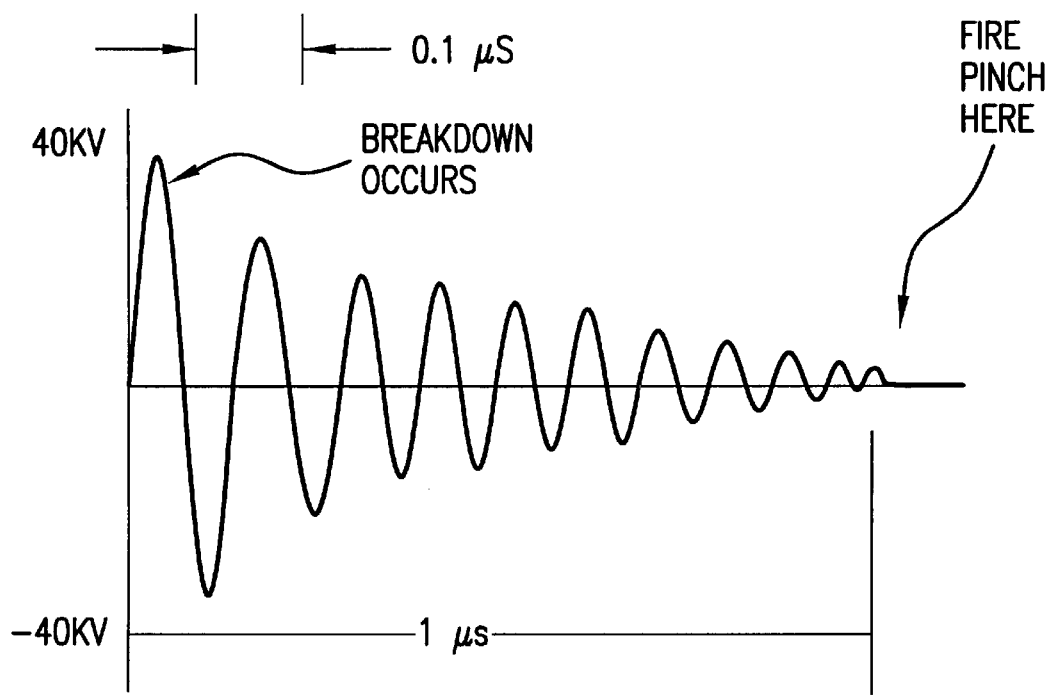
FIG. 1F shows the pulse shape of an RF preionizer system for the FIG. 1 device.

FIGS. 1A and 1F shows features of a preferred preionization technique. In this case 8 spark devices powered by 10 megahertz RF generator 60 as shown in FIG. 1A provides the needed preionization with one microsecond pulses timed to coincide with the pinch discharges. The preferred timing is shown in FIG. 1F. The RF power is applied about 1 microsecond before the pinch discharge begins. Preionization breakdown occurs in the gap between the anode 8A and the cathode 8B about 0.1 microsecond into the RF pulse. Spark occurs between the end of the spark devices and surfaces of the anode and cathode. This causes the region between the anode 4 cathode to be filled with a highly conductive plasma. This preionization plasma serves two purposes. First, it is designed to exist during the entire time that C2 is charging up. The plasma conductivity is kept high enough to create a very low impedance path to the normal leakage current flowing through saturable inductor LS3. This maintains the anode potential at close to ground while C2 is charging which helps ensure complete energy transfer to the anode when inductor LS3 saturates and the main discharge begins. Without a sufficiently conducting plasma generated by the preionization, the anode would charge up to a voltage high enough to cause a premature breakdown of the main discharge in the anode-cathode gap prior to the maximum voltage on C2. The second purpose of the preionization plasma is to provide an initial plasma source for the main discharge, making it more uniform and more consistent from pulse to pulse.

The RF pulse shape is shown in FIG. 1F. It starts out at about kV and dies off to near zero toward the end of each pulse. Currents are about 100 amp for each of the eight spark devices for a total of about 800 amp. The spark devices are shown in FIG. 1A.

Each plug is pressurized serially through ports 64 with $SF_6$ gas to prevent internal breakdown in space 62 and each plug is provided with a commercial high voltage connector 64 supplied by Fisher.

Test Results

FIGS. 1D and 1E show test results from the fourth generation prototype device. FIG. 1D shows the pulse shape on capacitor C2 and across the electrodes and FIG. 1E shows a measured photo diode signal with Xenon as the active gas. Note that the EUV light pulse begins about 100 ns after the beginning of the electrical discharge and peaks about 130 ns after the start of the discharge.

Active Gas and Buffer Gas Control

Techniques for control of active gas and buffer gas is described by reference to FIGS. 2A, 2B and 2C.

Injection Through Anode

Figure 2A:
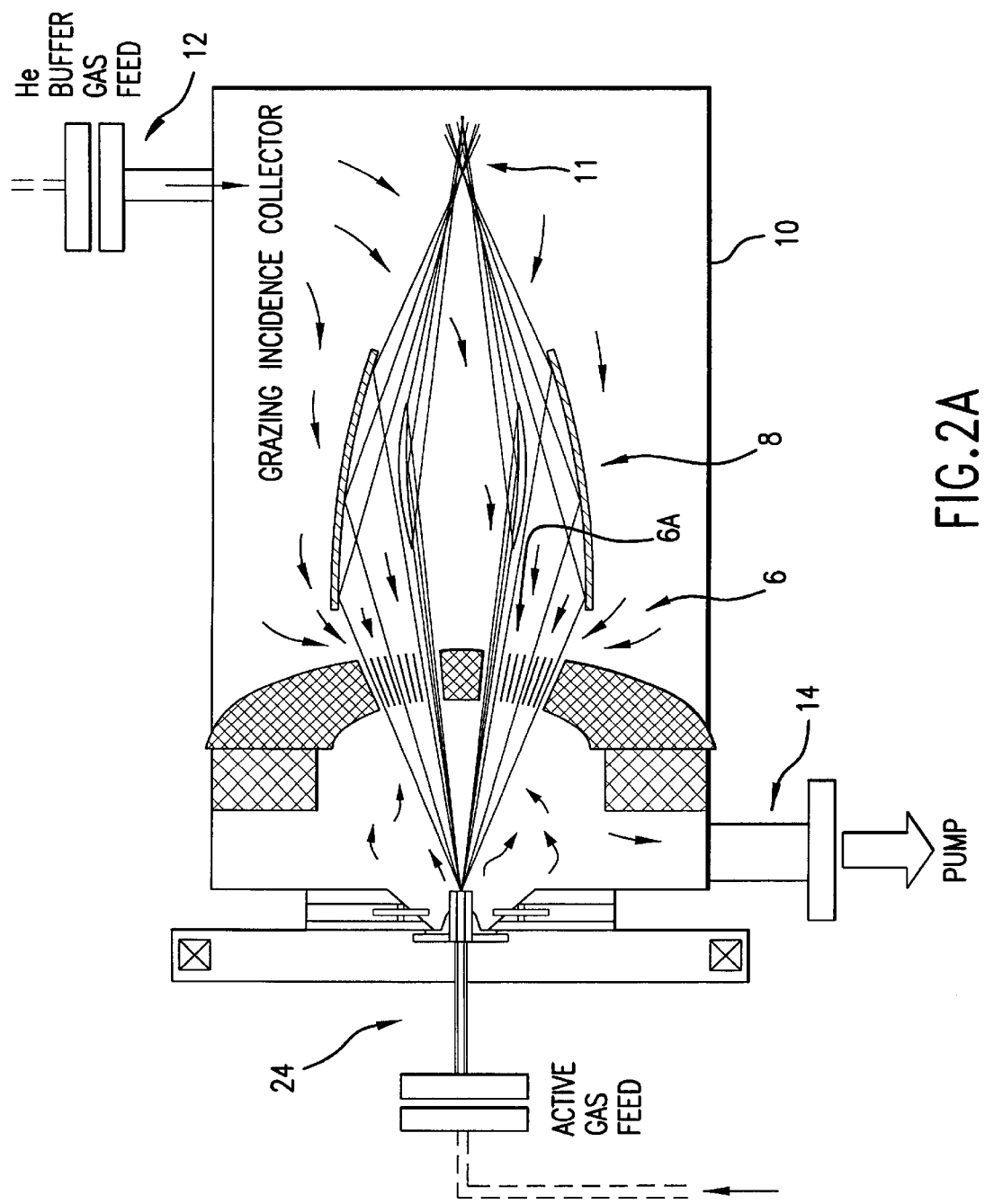
FIGS. 2A, B, C, D, and E show techniques for controlling active gas and buffer gas in the vacuum vessel of preferred embodiments.

FIG. 2A shows features of a preferred embodiment of the present invention in which the active gas in this case Xe (mixed 1 part and 14 parts with helium) is injected through the anode. The buffer gas (in this case 100% He) is injected at 12 in the region downstream of collector-director 8. Debris collector 6 comprises nested conical sections providing narrow passageways in line with rays extending from the center of the pinch region to collector-director 8. These passageways permit about 85% of the photons directed toward collector-director 8 to pass but retards substantially the passage of debris generated in the pinch region which follows paths much more random than the EUV light. Gas is exhausted from vacuum chamber 10 through port 14 by a 40 liter per second vacuum pump. Therefore, buffer gas flow from gas feed 12 through the narrow passageways in debris collector 6 further retards the passage of debris from the pinch and also retards flow of the Xe active gas from the pinch region into the region of chamber 10. Therefore, substantially all of the debris from the pinch region and active gas injected through port 24 is either exhausted through port 14 or coats the surfaces of the debris collector or the inside walls of the vessel upstream of the debris collector. This avoids contamination of collector-director 8 by debris from the pinch and minimize attenuation of the beam by xenon gas since the flow of buffer gas through the narrow passageway in debris collector 6 prevents any significant quantity of xenon from entering the region downstream of debris collector 6.

Two Direction Gas Flow

Figure 2B:
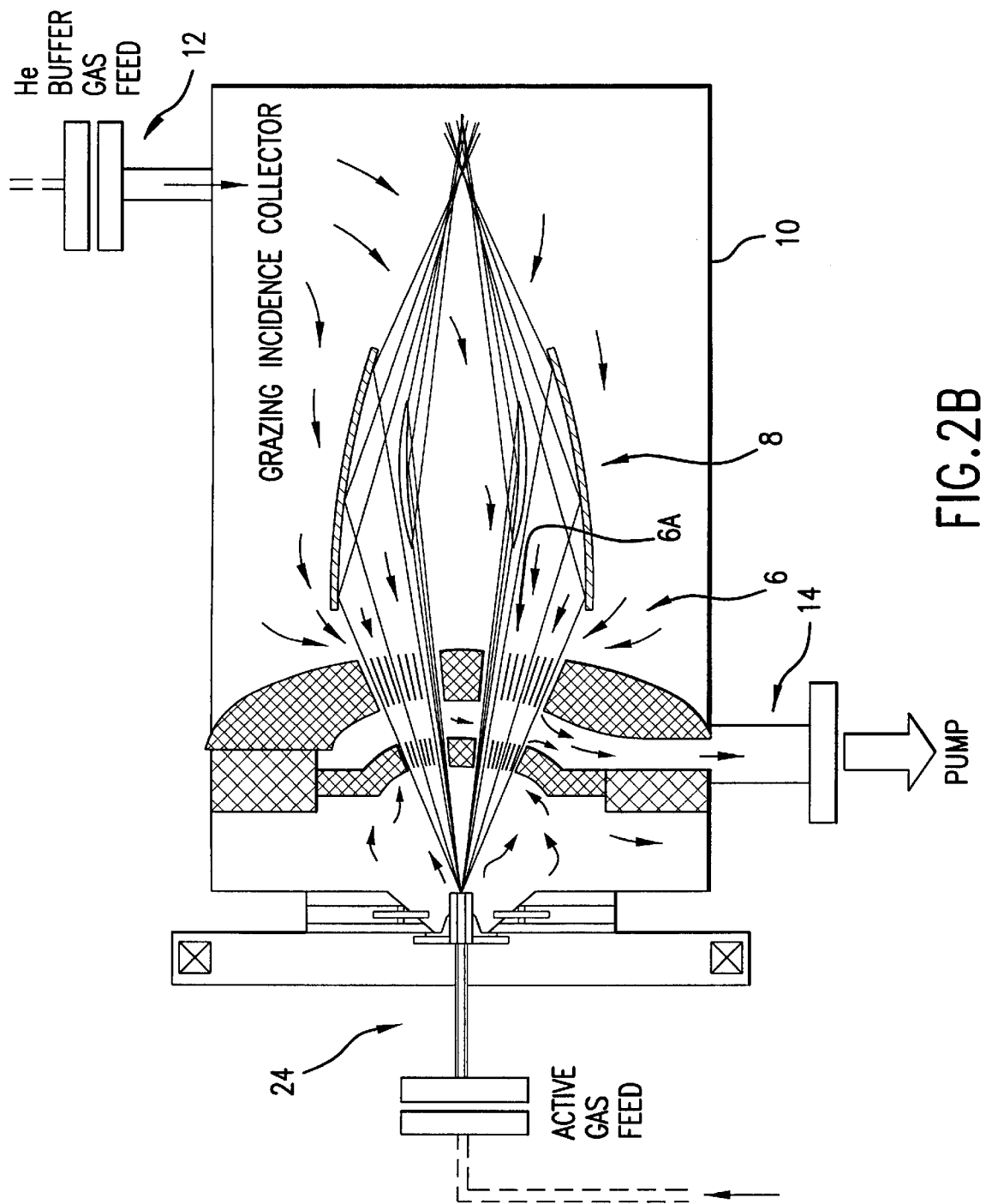

FIG. 2B shows features of an embodiment of the present invention in which two directional gas flow is utilized to permit a controlled concentration of active gas near the pinch region with minimum concentration of active gas in the downstream portion of the EUV beam path. In this case the active gas is introduced through the center of anode 18A as shown at 24 FIG. 2B. In this preferred embodiment, the introduced gas is a 1/15 to 14/15 mixture of xenon and helium. Helium is also introduced at 12 as in the above embodiment. The introduced gas from both sources is exhausted at 14 with a vacuum pump of the type described above. Gas flows are controlled to produce a pressure of about 0.75 torr in the pinch region and a pressure of about 1 torr in the collector-director region so that gas flow from the collector director region is much greater than the flow from the pinch region.

Upstream Injection of Active Gas

Figure 2C:
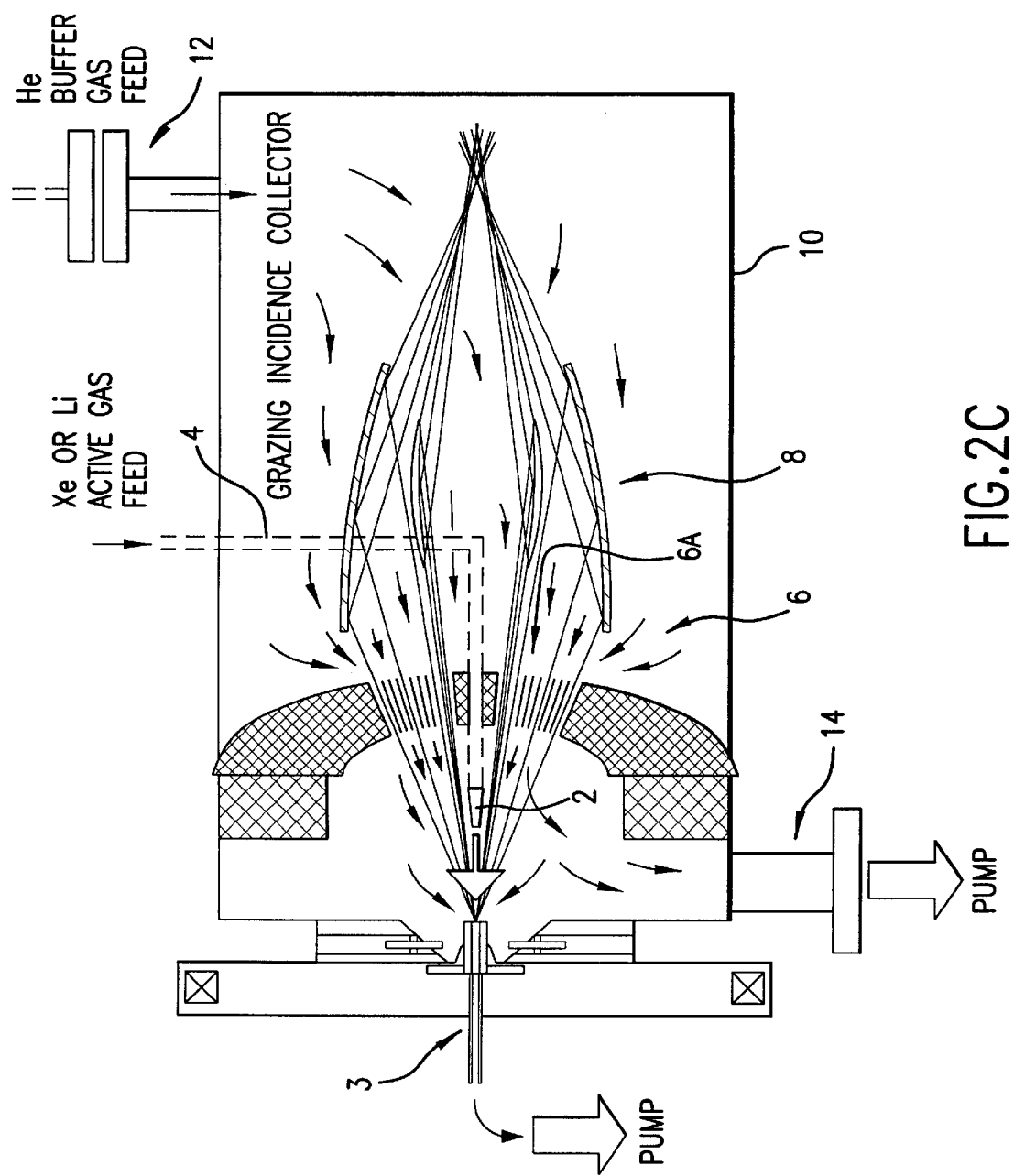

FIG. 2C shows another preferred technique for controlling debris and the active gas and minimizing EUV absorption by the active gas. Gas pressure in the pinch region is about 0.5 torr. In this embodiment, gas flows within vacuum chamber 10 are arranged to help deter debris from the pinch region from reaching the region of collector director unit 8 and to minimize the quantity of active gas in the region beyond the immediate volume surrounding the pinch region. The active gas which could be, for example, xenon is injected about 3 centimeters upstream of the pinch region through nozzle 2 at a rate of about 5 SCCM and almost all of it is exhausted via a exhaust port 3 running through electrode 18A along its axis at a pumping speed of 50 liter/second. The exhaust flow is provided by a vacuum pump such as design blower backed by an Anect Iwata ISP-500 scroll pump available from Synergy Vacuum a Canadian company. This provides a pump speed of 40 liters per second. The xenon is fed into nozzle 2 through gas pipe 4 running through the central region of debris catcher 6. Debris catcher 6 is comprised of nested conical sections at 6A having surfaces aligned with light rays extending out from the center of the pinch site and directed toward collector director 8. These nested conical sections provide a relatively unobstructed passageway for EUV photons produced in the pinch which are directed toward collector director 8. The passageways are narrow and about 10 cm long.

Debris collector 6 collects (by condensation) tungsten vaporized from tungsten electrode 18A. (If the active gas is lithium vapor debris, the vapor will condense on the surfaces of debris collector 6.)

Buffer gas which in this embodiment is helium is injected downstream of collector director 8 as shown at 12 and most of the buffer gas is exhausted from vacuum chamber 10 through exhaust port 14 by a vacuum pump (not shown) of the type described above. About 90 percent of the helium flow passes through collector director 8 in the direction toward the pinch region and all of the buffer gas passes through the nested conical section region 6A. As in the above example, this gas flow helps deter debris produced in the pinch region from reaching director-collector 8 and also minimizes the amount of active gas in the path of the light being collected and directed by collector-director 8 to produce the output EUV beam. These features are important because any debris accumulation on the surfaces of debris collector 8 reduces its reflectivity and active gas in the EUV beam path will attenuate the beam.

Gas exhausted through port 3 is preferably filtered and exhausted to the atmosphere. Gas exhausted through port 14 may also be exhausted to the atmosphere without excessive gas cost since total helium gas flow in this system is only about 16 grams per hour. Alternatively, the helium and/or the active gas may be separated and recirculated.

Lithium As Active Gas

In the above examples, xenon is described as the active gas. Xenon is relatively easy to work with compared to lithium which must be vaporized to its gaseous state. Lithium vapor may more efficiently convert the pinch energy into useful light at the desired wavelength range. Lithium is a solid at room temperature and a liquid between the temperature of 180° C. and 1342° C. Many methods are available to introduce lithium vapor into the discharge and pinch regions. Lithium can be heated to its vapor temperature and introduced as a vapor. It could be introduced as a solid or liquid and vaporized by the discharge or the pinch or it could be vaporized with other forms of energy such as a high power laser pulse or by some other form of heating such as a resistance heating element, an electric discharge or rf heating. Lithium can also be introduced as a compound such as $Li_2O$, $LiH$, $LiOH$, $LiCl$, $Li_2CO_3$, $LiF$, $CH_3$ or their solutions in water or other liquid.

Figure 2D:
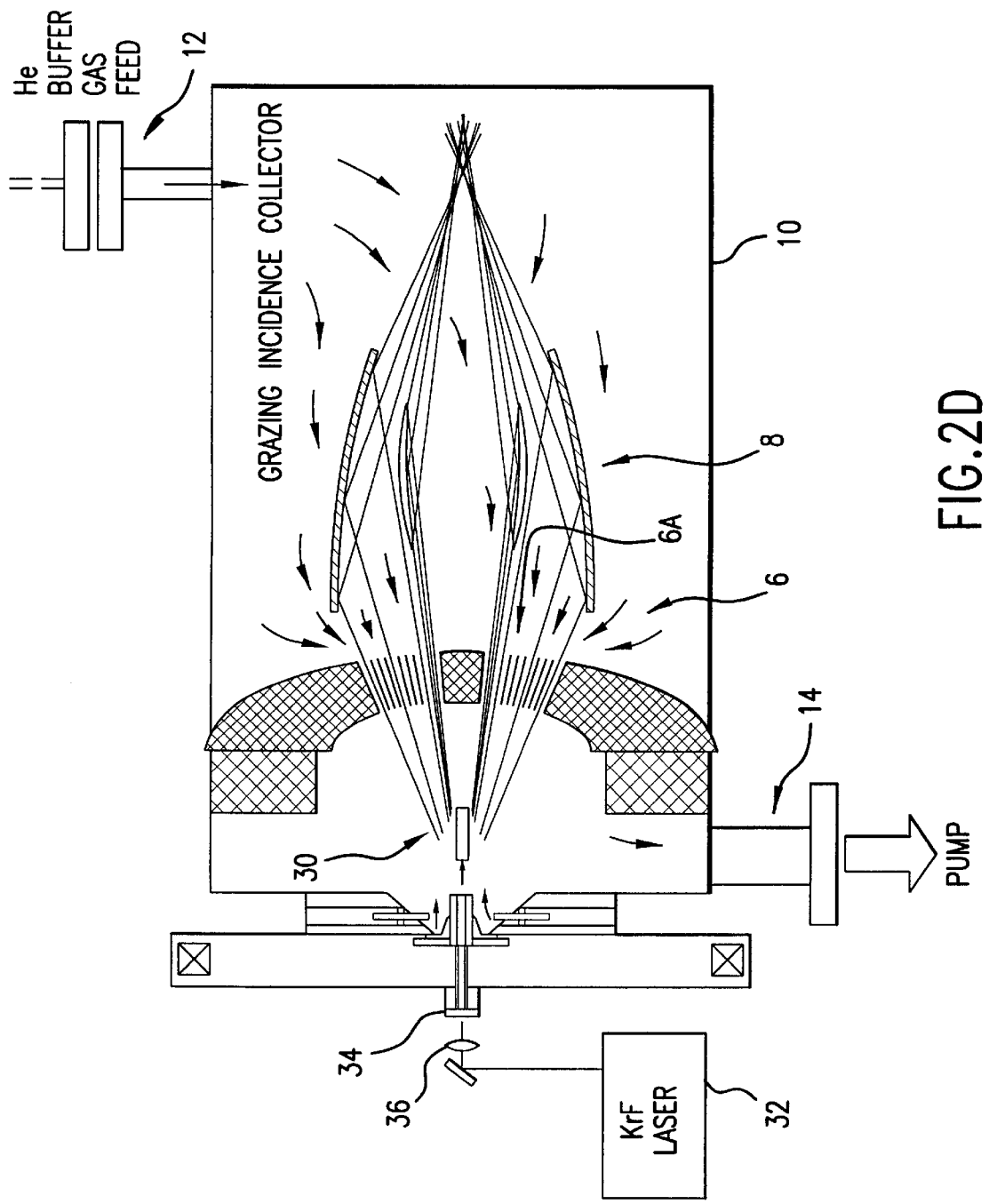

Lithium may also be delivered to the pinch region by means of laser induced evaporation or ablation. Lithium metal target 30 will be attached to a holder mounted from the central disk in the debris collector as shown in FIG. 2D. In one preferred example, a KrF excimer 32 produces a pulsed laser beam of 248 nm wavelength and energy of 100 mJ to 200 mJ per pulse, with effective pulse length of 50 ns is passed through a window 34 mounted on the upstream side of the anode. The light will pass through the hollow anode and be focused by means of a lens 36 mounted external to the vacuum chamber to a spot of approximately 1 mm in diameter. This laser intensity and spot size is sufficient to heat the Li metal at such a high rate that the temperature rise is dominated by the latent heat of vaporization. The threshold power density required is about $5 \times 10^7$ W/cm². At lower power Li can also be evaporated at a rate governed by its vapor pressure at a given temperature.

Figure 2E:
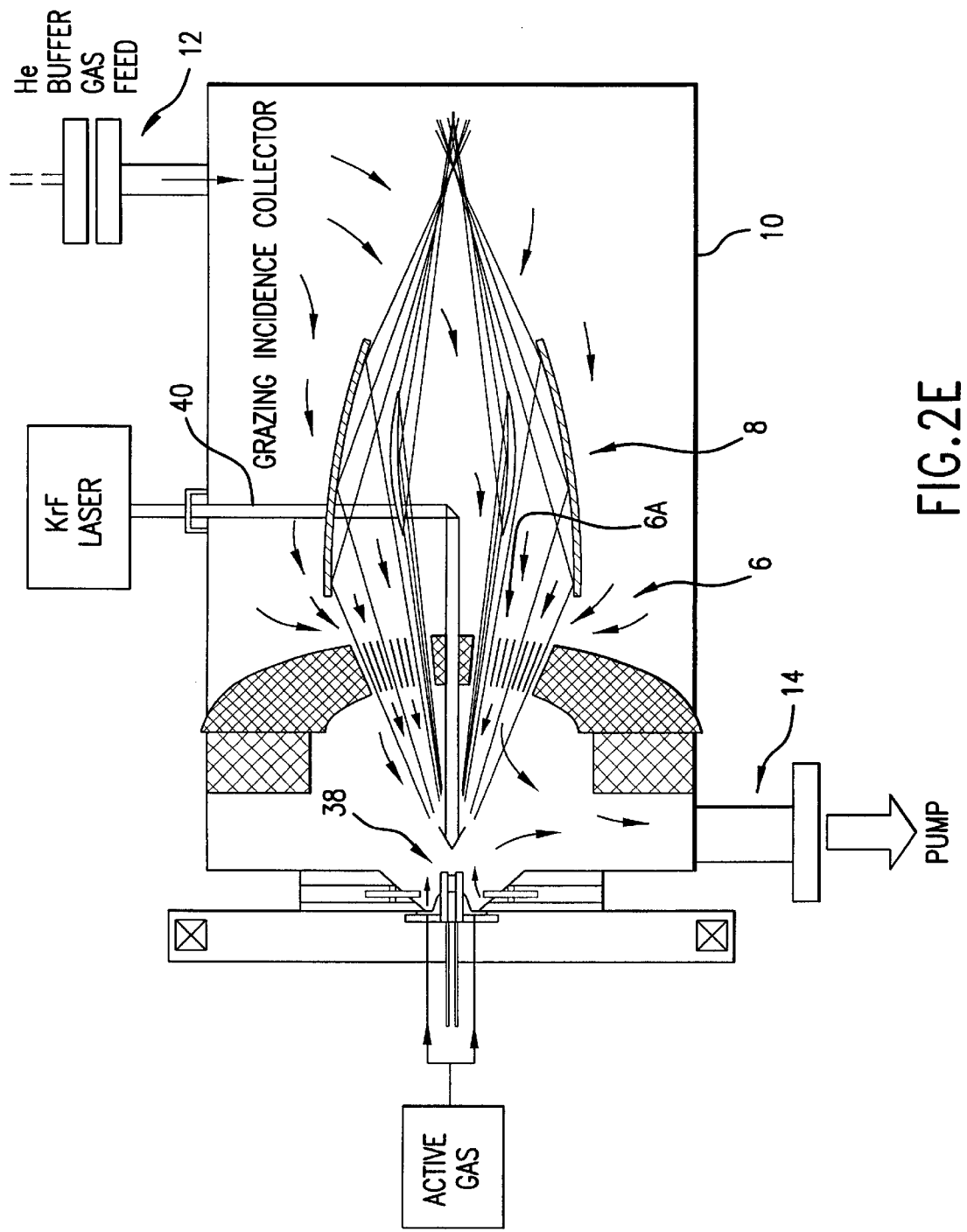

In an alternative embodiment the central region of the anode is packed with Li metal as shown at 38 in FIG. 2E and the laser beam is passed through the center of the debris shield. In this version the debris shield 8 as shown at 40.

In another technique by which we can deliver Li to the pinch region is to attach the Li metal to a tungsten plate which is in turn mounted on a housing containing a permanent magnet. This arrangement is mounted on an insulating shaft from the debris collector. Li metal is further covered with a tungsten mask to expose only a small region of Li. A radio frequency produced plasma is generated in the region in front of the Li target by means of an RF generator operating at a frequency of 500 MHz to 2.45 GHz. The discharge may be operated in either pulsed or CW mode. In pulsed mode, the discharge will be synchronized with the plasma pinch. An RF power of 5000 W is generally sufficient.

The generated plasma will be composed of the buffer gas, generally He. He ions will be extracted from the plasma by application of a negative bias voltage onto the Li target. A bias of 500 V to 2000 V will be sufficient. He+ions striking the Li will sputter Li atoms from the surface. Sputter yields over the bias energies mentioned vary from approximately 0.2 to 0.3 for normal incidence. Significantly higher yields can be expected for grazing incidence and for Li at elevated temperature.

Collector-Director

Tandem Ellipsoidal Mirror

Figure 3:
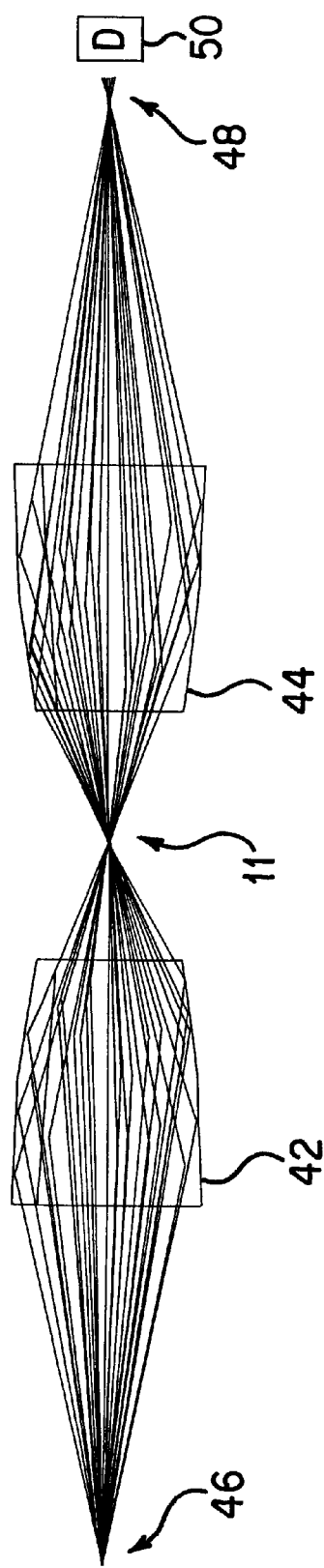
FIG. 3 shows a tandem ellipsoidal mirror arrangement.

FIG. 3 shows a preferred collector director design for greatly improving the EUV beam profiled. This is a tandem ellipsoidal mirror unit which collects and directs the EUV radiation produced in the plasma pinch.

In most lithography applications the target region needs to be exposed uniformly. A single or nested ellipsoidal mirror of the type shown in FIG. 2A when used to collect and re-focus the EUV radiation produces a very non-uniform annulus of radiation upstream and downstream of focal point 11 shown in FIG. 2A. This is a natural effect caused by the geometry of the ellipsoidal collector. The front of the mirror collects a greater solid angle of the source emission per unit mirror surface area than the back of the mirror. This effect can be reversed by using a second ellipsoidal mirror 44 in tandem with the first mirror 42 as shown in FIG. 3. (In this embodiment, single ellipsoidal mirrors are used without a second nested ellipsoidal mirror.) The second ellipsoidal mirror 44 is a mirror image of the first ellipsoidal mirror 42 "reflected" about the second focal point of the first mirror. This places the second ellipsoidal mirror on the same optical axis as the first mirror so that its first focal point is at the second focal point of the first mirror. In this case of the tandem ellipsoidal mirror the radiation leaving the second focal point of the second mirror is annular but the radiation within the annulus is uniform. The exposure uniformity is now a function of the surface figure of the ellipsoidal mirrors and not the inherent collection geometry of the ellipsoidal mirror.

Analysis

The optical characteristics of the tandem ellipsoidal mirror were analyzed by Applicants with the ray tracing code, TracePro, supplied by Lambda Research Corporation of Littleton, Mass. The EUV radiation from the DPF source is incoherent. Consequently, a ray tracing code can be used to determine the properties of the radiation collected and leaving the tandem mirror. The EUV radiation requires special reflective surfaces such as molybdenum or ruthenium. This analysis was performed under the assumption that the mirror surface has a perfect ellipsoidal reflector and that the radiation is not polarized during reflection. The mirror surface was assumed to be pure ruthenium reflecting at 13.5 nm. Also, the source has been assumed to be a 50 micron diameter disc and that the radiation emits isotropically from each point on its surface. These assumptions do not detract from the basic ability of the tandem mirror to produce a uniform annular exposure region.

Figure 3A:
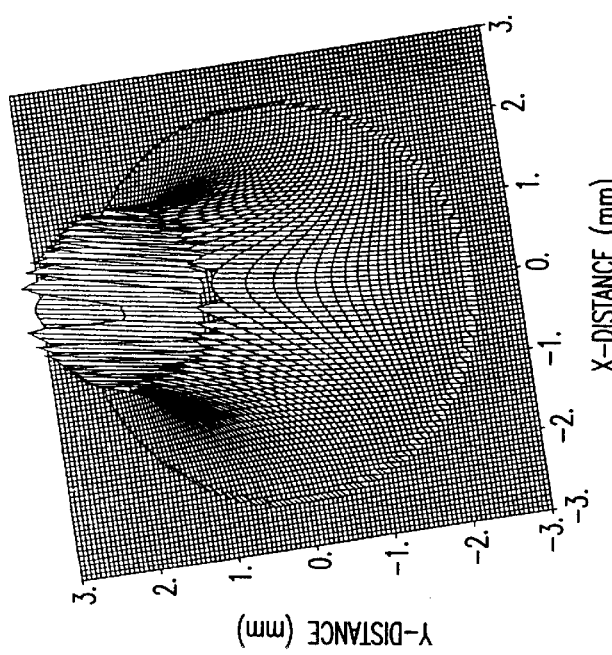
FIGS. 3A, B and C show the shape of the EUV profile at just downstream of two focuses.
Figure 3B:
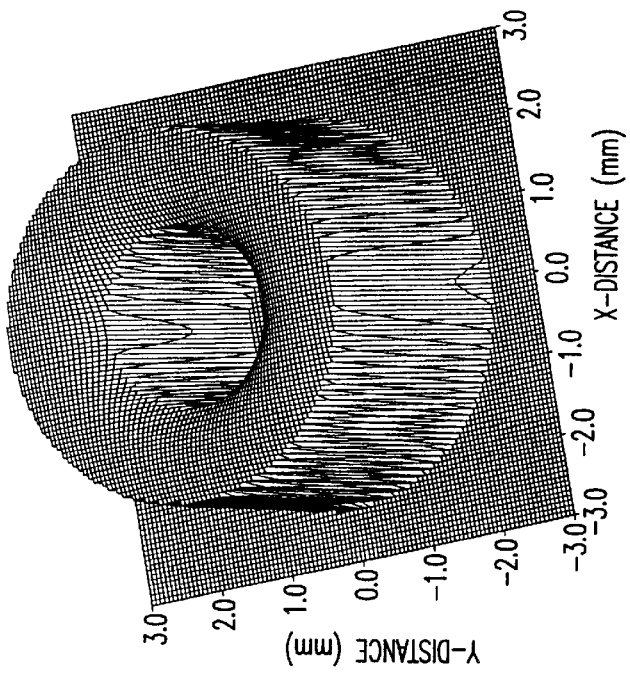
Figure 3C:
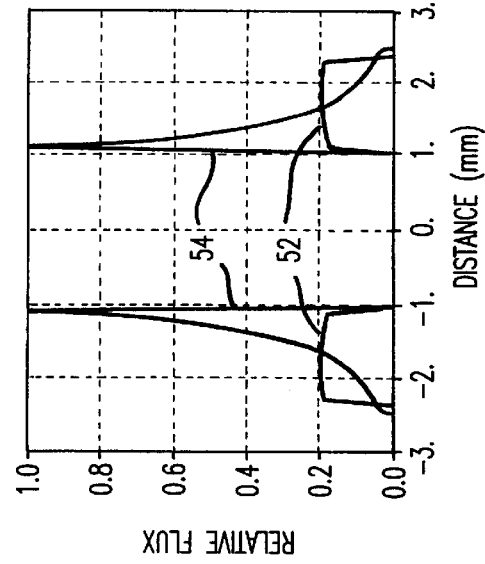

The geometry of the tandem ellipsoidal mirror is illustrated in FIG. 3. Both mirrors have the same parameters. Their minor radius is 40 mm and their focal length is 150 mm. The mirrors are each 100 mm long and have been cut through their minor diameter. The figure also shows a few random rays collected by the first mirror. A fraction of the radiation that leaves the plasma pinch source 46 at the first focal point of the first mirror is collected and re-focused at the second focal point 11 of the first mirror. The radiation leaving focal point 11 at 300 mm from source 46 is collected by the second ellipsoidal mirror and re-focused at the second focal point of the second mirror 48 at 300 mm from focal point 11. At focal point 48 a 1:1 image of the source is produced. As the radiation leaves focal point 48, the rays diverge to produce an annular exposure area at detector 50 which is located 9 mm from focal point 48. The intensity in this annular region is uniform as shown by the TracePro calculation in FIG. 3A. The uniformity in the main annular region is within ±2.5% of the mean value. A simulation performed by Applicants of the beam profile at detector 50 is shown in FIG. 3B which may be compared with a similar simulation made for the beam cross section at 9 mm downstream of focal point 11. A cross section of the two profiles is compared in FIG. 3C with the detector 50 cross section shown at 52 and the cross section of the FIG. 3A beam profile at 54.

Fabrication

The techniques for ellipsoidal mirror fabrication have been improved over the past few 10s of years. The surface quality of these mirrors can now be made to satisfy the requirements of surface figure, surface roughness, and the material of the reflecting surface for their use in the EUV region. Four materials have been identified as possible candidates for the EUV ellipsoidal mirror surface: molybdenum, ruthenium, rhodium, and palladium. These materials have relatively high grazing incidence reflectivity at 13.5 nm. The grazing incidence reflectivity must remain high at relatively high angles to allow the mirror to collect a reasonable solid angle subtended from the source. Theoretically, ruthenium has the highest collection efficiency of the four materials listed.

These mirrors are fabricated though a series of processes. First, a mandrel is made that has the outside figure of the desired mirror. Typically, the mandrel is made undersize using aluminum and then coated with electroless nickel containing 15% phosphorus to make the mandrel oversize. The electroless nickel is put on about 0.5 mm thick so that the entire surface can be diamond turned to the desired mirror surface figure by vendors such as Corning Netoptic with offices in Marlborough, Mass. This typically leaves about 0.1 mm of nickel on the mandrel surface. Although the present technology of diamond turning is very good the surface at this stage is not adequate for use as an EUV mirror. The diamond turning can be accurate enough for the figure requirements that include the deviations from the elliptical surface front-to-back and the roundness of the surface but the micro-roughness is too high. The diamond turned surface must be polished to reduce the micro-roughness to less than 0.5 nm RMS. The hardness of the nickel surface imparted by the high phosphorus content of the electroless nickel is required for the high degree of polishing. After the electroless nickel surface is adequately polished and the surface figure is within specifications, the reflecting surface material is coated onto the mandrel surface. The exact procedure used to coat the surface is dictated by the properties of the reflecting material being added to the surface. After the reflecting coating has been placed on the mandrel, nickel is electroformed over this surface to a thickness of about 0.5 mm. The electroformed nickel is removed from the mandrel by applying force along the axis of the mandrel between the mandrel and the electroformed nickel. The reflecting surface stays with the electroformed nickel shell to form the mirror as it slides off the nickel surface on the mandrel. The surface of the highly polished electroless nickel with the high phosphorus content acts as a natural release agent for the reflecting surface. After the mirror has been removed from the mandrel and the mandrel re-polished, the mandrel is then available to make additional mirrors that are exact copies of the first mirror.

Alignment

The positioning of the mirrors relative to the source and to each other is critical to the correct function of the tandem ellipsoidal mirrors. Alignment can be accomplished on an optical bench with a source placed at the same location as the DPF EUV source. One must take advantage of the optical properties of these ellipsoidal mirrors. If a detector plane is placed perpendicular to the optical axis near the second focal point, the small source, 50 microns diameter, e.g., can be placed near the first focal point of the ellipse. The image will only be centered and symmetric if the detector is at the second focal point. After the axial location of the second focal point has been determined, the detector array can be moved away from the focal point. Now the image will only be symmetric if the source is on the mirror axis. This requires positioning the source in two spatial dimensions. The axial location of the first focal point can be determined by moving the detector to the second focal point and then moving the source along the mirror axis until the detector gives a maximum signal in the image center.

This procedure must be repeated for the second mirror. After the two mirrors have been aligned, the entire assembly must be transferred to the DPF. The fixture must be adequately keyed to place the EUV source at the first focal point of the first mirror. The accuracy of positioning must be at least 25% of the effective diameter of the DPF EUV source. The present estimate of the DPF source diameter is 80 microns while looking along the machine axis. Hence, the expected alignment accuracy is 20 microns in the plane perpendicular to the machine axis. The axial alignment of the tandem mirror is not as critical and is expected to be about 0.5 mm.

Debris Mitigation

Both the mid-focal point 11 between the two mirrors and the final focal point 48 allow the DPF source region to be isolated from the lithography exposure region. At these points the EUV radiation can pass through pinholes that block any source debris or active gas (that penetrated into the region of the first elliptical mirror unit) from reaching the exposure chamber but not the EUV radiation. Also, these small pinholes allow the exposure chamber to have a much lower pressure than that required for DPF operation.

Lithography Projection Optics

The EUV projection optics should be designed to map the source spot into the entrance pupil of the projection optic and to map the far field intensity (i.e. the energy vs. angle) of the source onto the reticle. Such a design is preferred because the uniformity in the entrance pupil, though important, is not critical while the uniformity at the reticle plane is critical. This design concept exploits the fact that the emission is isotropic and thus has uniform intensity vs. angle. The dual mirror concept restores this uniform intensity vs. angle property (at least within the cone of capture angle for the mirrors). The EUV illuminator take the "ring" of intensity versus angle, break it into pieces or arcs, and overlay these arcs onto the reticle. This further improves the uniformity and can be done in EUV systems since they are scanners and thus require illumination only over a slit region.

It is understood that the above described embodiment are illustrative of only a few of the many possible specific embodiments which can represent applications of the principals of the present invention. Active gases other than lithium and xenon could be used and these other active gases would be needed if wavelengths in ranges other than the ranges near 13.5 nm are desired. The passageways in the debris collector could be any of many different shapes. Preferably, however, the passageways should be aligned with rays from pinch site and should be long enough and narrow enough to impede gas flow through them.

The collector-director can be comprised of the single unit or the tandums unit as described.

It could be comprised of a single shape, two shapes one nested inside the other as shown in FIGS. 2A, 2B and 2C or more than two nested shapes. The collector-director can be arranged to focus the EUV beam as shown in the above FIGS or to create any desired beam properties such as a parallel beam or a diverging beam. When in the claims we refer to beam path we mean the path of the beam from the pinch through the collector-director and by beam direction we mean the direction of EUV rays as they pass from the pinch region through the debris collector and the collector-director. Many known techniques could be applied to improve the reflectivity of the surfaces of the collector-director unit. As discussed above, typically extremely smooth surfaces will be desired but in some cases some surface roughness or some surface patterns may be desirable.

Accordingly, the reader is requested to determine the scope of the invention by the appended claims and their legal equivalents and not by the examples which have been given.

What is claimed is:

1. A high energy photon source for producing an extreme ultraviolet light beam defining a beam path and a beam direction said source comprising:

A. a vacuum chamber,

B. at least two electrodes mounted coaxially within said vacuum chamber and defining an electrical discharge region and arranged to create high frequency plasma pinches at a pinch site upon electrical discharge, C. a working gas comprising an active gas and a buffer gas, said buffer gas being a noble gas, and said active gas being chosen to provide light at least one spectral line, D. a gas control system for supplying the buffer gas and the active gas to said vacuum chamber and exhausting gas from the vacuum chamber so as to maintain the active gas at a desired concentration in the discharge region and minimize the active gas in the beam path outside the discharge region, E. a pulse power system comprising a charging capacitor and a magnetic compression circuit said magnetic compression circuit comprising a pulse transformer for providing electrical pulses and voltages high enough to create electrical discharge between said at least one pair of electrode, F. a collector-director unit configured to collect EUV beams from said pinch site and direct them along a predetermined path, and G. a debris collector mounted near said pinch site and comprising at least 20 narrow passageways defined by a plurality of walls aligned with EUV beams emanating from said pinch site and directed toward said collector-director;

wherein said debris collector is comprised of two parts, an upstream part and a downstream part and said gas control system comprises a gas exhaust part for exhausting vacuum chamber gas at a location between said upstream part and said downstream part.

2. A high energy photon source as in claim 1 wherein one of said two electrodes is a hollow and said active gas is introduced into said vacuum chamber through said hollow electrode.

3. A high energy photon source as in claim 1 wherein said gas control system is configured so that buffer gas flows through said downstream part in a direction opposite said beam direction and so that said active gas flows through said upstream part in said beam direction.

4. A high energy photon source as in claim 1 wherein said active gas is introduced into said vacuum chamber as a metal vapor.

5. A high energy photon source as in claim 4 wherein said metal vapor is lithium vapor.

6. A high energy photon source as in claim 5 and further comprising a laser system configured to produce said lithium vapor by illuminating lithium metal with short laser pulses.

7. A high energy photon source as in claim 6 wherein said laser system is an excimer laser.

8. A high energy photon source as in claim 6 wherein one of said electrodes is hollow and said lithium metal is positioned downstream of said hollow electrode and said laser pulses are directed at said lithium metal through said hollow electrode.

9. A high energy photon source as in claim 6 wherein said lithium metal is located on or within one of said electrodes and said laser pulses are directed along an axis of said beam path toward said lithium metal.

10. A high energy photon source as in claim 1 and further comprising a preionization system comprising a plurality of spark devices.

11. A high energy photon source as in claim 1 wherein said preionization system comprises an RF power source.

12. A high energy photon source as in claim 11 wherein said preionization system is configured to initiate preionization approximately 1 microsecond prior to electrical discharges produced by said pulse power system.

13. A high energy photon source as in claim 1 wherein said collector-director unit comprises a tandem ellipsoidal mirror.

14. A high energy photon source as in claim 1 wherein said active gas comprise xenon.

15. A high energy photon source as in claim 14 wherein said noble gas is helium.

16. A high energy photon source as in claim 1 wherein said pulse power source comprises at least one capacitor optimized to provide peak capacitor current simultaneous with said plasma pinch.

17. A high energy photon source as in claim 1 wherein said pulse power system comprises a resonance charging system for charging said charging capacitor.

18. A high energy photon source as in claim 1 wherein said magnetic compression circuit comprising at least two saturable inductors and a bias circuit for biasing said at least two saturable inductors.

19. A high energy photon source as in claim 1 and further comprising an energy recovery circuit for recovering on said charging capacitor energy reflected from said electrodes.

20. A high energy photon source as in claim 1 wherein said charging capacitor is comprised of a bank of individual capacitors.

21. A high energy photon source as in claim 1 wherein said pulse transformer is comprised of a plurality of ring shaped cores comprised of magnetic material and a primary winding in electromagnetic association with each of said cores.

22. A high energy photon source as in claim 21 wherein said magnetic material is comprised of high permability film wrapped on a mandrel.

23. A high energy photon source as in claim 21 wherein said pulse transformer defines a secondary winding comprised of a plurality of rods.

24. A high energy photon source as in claim 22 wherein said mandrel form a part of said primary winding for each primary winding.

25. A high energy photon source for producing an extreme ultraviolet light beam defining a beam path and a beam direction said source comprising:

A. a vacuum chamber,

B. at least two electrodes mounted coaxially within said vacuum chamber and defining an electrical discharge region and arranged to create high frequency plasma pinches at a pinch site upon electrical discharge, C. a working gas comprising an active gas and a buffer gas, said buffer gas being a noble gas, and said active gas being chosen to provide light at least one spectral line, D. a gas control system for supplying the buffer gas and the active gas to said vacuum chamber and exhausting gas from the vacuum chamber so as to maintain the active gas at a desired concentration in the discharge region and minimize the active gas in the beam path outside the discharge region, H. a pulse power system comprising a charging capacitor and a magnetic compression circuit said magnetic compression circuit comprising a pulse transformer for providing electrical pulses and voltages high enough to create electrical discharge between said at least one pair of electrode, I. a collector-director unit configured to collect EUV beams from said pinch site and direct them along a predetermined path, and J. a debris collector mounted near said pinch site and comprising narrow passageways aligned with EUV beams emanating from said pinch site and directed toward said collector-director;

wherein one of said two electrodes is hollow said gas control system comprises an exhaust means for exhausting vacuum chamber gas through said hollow electrode;

wherein said beam path defines a beam axis and said active gas is introduced into said vacuum chamber through a nozzle located on said beam axis and directed toward said hollow electrode.

26. A high energy photon source as in claim 25 wherein said active gas is introduced into said vacuum chamber at a location between said hollow electrode and said debris collector.

27. A high energy photon source as in claim 25 wherein said hollow electrode is a hollow anode.

* * * * *